United States Patent [19]

Yamatake

[11] Patent Number: 4,755,767
[45] Date of Patent: Jul. 5, 1988

[54] HIGH GAIN AMPLIFIER USING TWO CURRENT MIRRORS

[75] Inventor: Mineo Yamatake, Cupertino, Calif.

[73] Assignee: National Semiconductor Corporation, Santa Clara, Calif.

[21] Appl. No.: 79,544

[22] Filed: Jul. 30, 1987

[51] Int. Cl.⁴ .............................................. H03F 3/45
[52] U.S. Cl. ................................... 330/257; 330/255; 330/260
[58] Field of Search ............... 330/255, 257, 260, 288; 323/315, 316

[56] References Cited

U.S. PATENT DOCUMENTS 4,334,196  6/1982  Schade, Jr. .................... 330/257 X Primary Examiner—James B. Mullins
Attorney, Agent, or Firm—Gail W. Woodward

[57] ABSTRACT

An op amp is disclosed in which a high-gain differential input stage drives a high-gain common emitter stage that in turn drives an emitter follower buffer output stage. Adequate voltage gain is obtained in only two stages which makes the amplifier easy to compensate and much less subject to spurious oscillation.

6 Claims, 1 Drawing Sheet

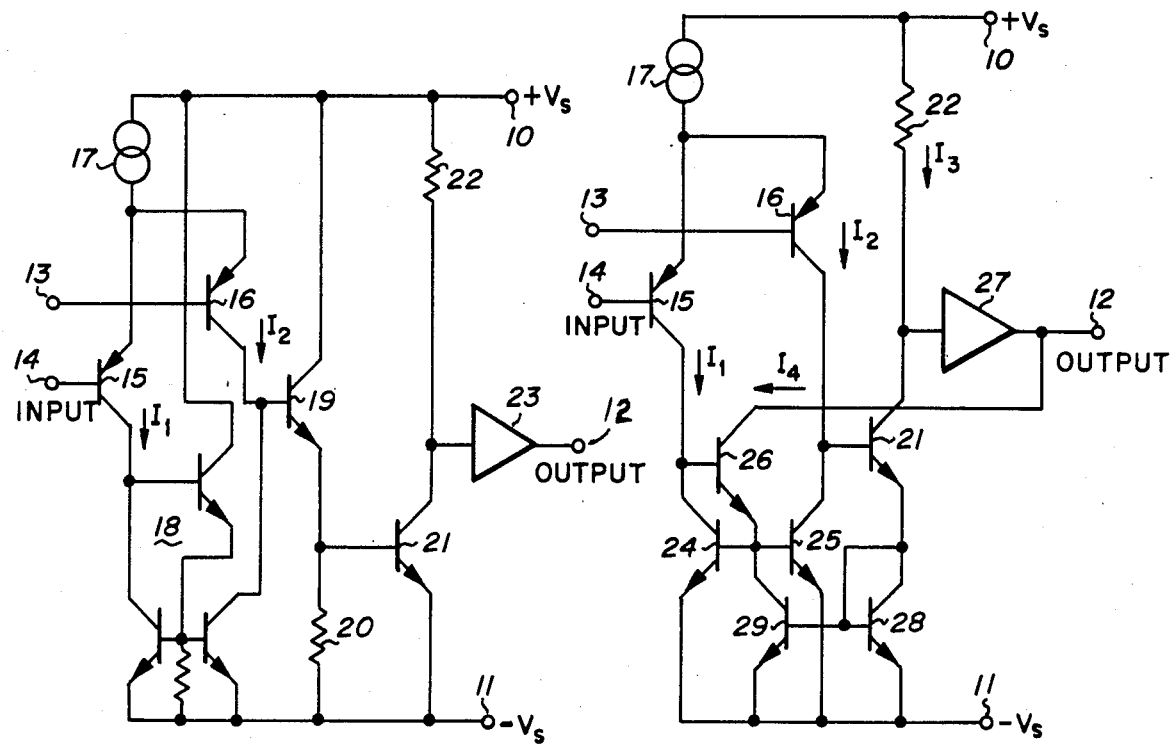
Fig_1 (PRIOR ART)  Fig_2
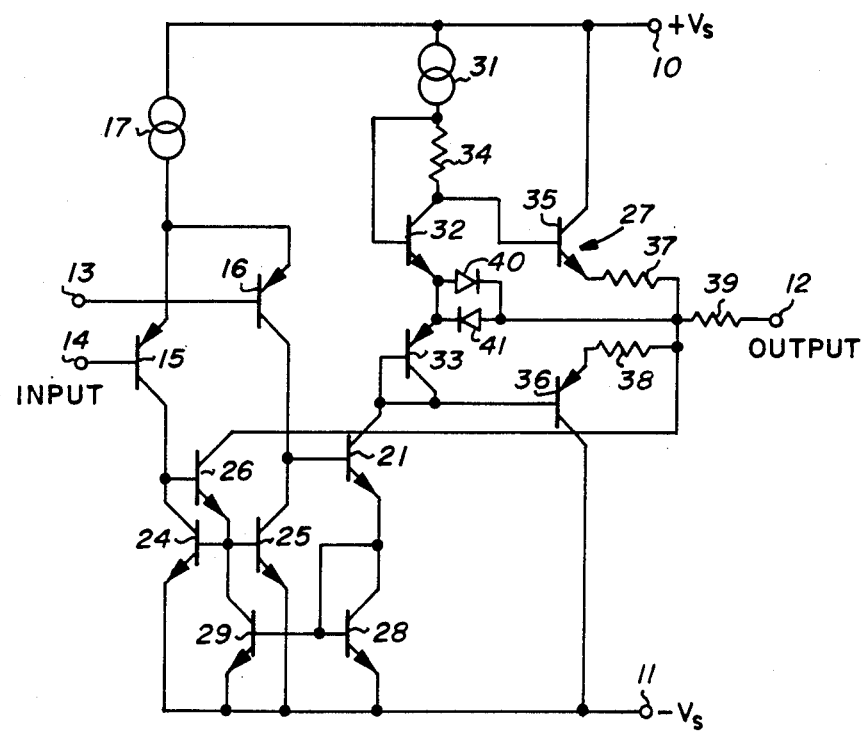
Fig_3

HIGH GAIN AMPLIFIER USING TWO CURRENT MIRRORS

BACKGROUND OF THE INVENTION

Operational amplifiers (op amps) have differential inputs that are substantially unresponsive to common mode voltages. Their outputs are typically single ended and their open loop voltage gain is very high. The input stage is typically a differential transistor pair that is supplied with a constant tail current. This means that the total current flowing in the transistor input pair is constant but the currents in the individual transistor can be modulated differentially.

If a differential to single ended signal conversion is to be accomplished it is often done in the input stage. This is typically achieved by coupling a current mirror load to the transistor input pair. U.S. Pat. No. 4,528,496 by Toyojiro Naokawa and Matsuro Koterasawa is assigned to the Assignee of the present invention. It teaches the basic current mirror circuits and its teaching is incorporated herein by reference. If a simple current mirror is employed, the diode-connected transistor presents a relatively low impedance to the differential pair and low voltage gain results. Also, the accuracy of the current mirror is dependent upon transistor Beta.

The Wilson current mirror does much to correct this and is in common use in op amps. The Wilson circuit has high accuracy in that its operation is much less dependent on transistor Beta and its output impedance is much higher.

Another useful current mirror load circuit, called a super diode mirror, employs a pair of active transistors and an emitter follower coupled between the collector and base of one of the transistors provides for the differential to single ended conversion. This kind of load circuit provides high accuracy and has high output impedance.

However, all of the above load circuits require the connection of a high imput impedance buffer to the current mirror load. This connection involves either the base of a common emitter amplifier stage or the base of an emitter follower buffer. In either case the succeeding stage output will typically involve a substantial signal voltage swing. Since this voltage variation will be reflected back through the stage it will result in a variable load on the transistor input pair.

SUMMMARY OF THE INVENTION

It is an object of the invention to provide a current mirror load for a differential transistor pair wherein the subsequent stage loading is compensated.

It is a further object of the invention to increase the gain of a differential pair of transistors by employing an active current mirror load in which the variable loading imposed by the subsequent amplifier is compensated and higher overall gain is thereby present.

These and other objects are achieved in the following manner. An active super diode current mirror load is coupled to the collectors of a differential transistor pair in the form of a pair of load transistors. An emitter follower is employed to couple the collector of one of the load transistors to its base thereby to force it to function as a diode. This creates the single-ended output at the other collector of the load transistors. The emitter follower has its collector coupled to the following stage output by way of a unity gain buffer which could also be the op amp output stage. The following stage which is a high gain amplifier, has its emitter coupled to the input transistor of a second current mirror which has an output transistor coupled to the emitter of the emitter follower transistor. Thus, the second current mirror causes the same currents to flow in the high gain amplifier stage and the emitter follower. It can be seen that if the emitter follower transistor is matched to the high gain amplifier transistor, the load transistors will operate into balanced loads. This means that when the high gain amplifier reflects a varying load back into the first stage, the emitter follower will similarly load the other transistor in the differential pair so as to create a balance. The high gain amplifier stage will therefore not act to reduce the differential stage gain because its loading constitutes a common mode signal.

BRIEF DESCRIPTION OF THE DRAWING

FIG. 1 is a schematic diagram of a prior art circuit in which a differential input stage employs a super diode current mirror load coupled to drive an emitter follower buffer which is followed by a high-gain common-emitter amplifier.

FIG. 2 is a schematic diagram of the circuit of the invention.

FIG. 3 is a schematic diagram of an operational amplifier employing the circuit of the invention.

DESCRIPTION OF THE PRIOR ART

FIG. 1 is a schematic diagram of an input circuit useful in integrated circuit op amps. A power supply $V_S$ is connected $+$to terminal 10 and $-$ to terminal 11. The output appears at terminal 12 as a single-ended signal. The input at terminals 13 and 14 is differentially responsive and is unresponsive to common mode input signals. Input transistors 15 and 16 are PNP devices connected differentially and provided with a constant tail current by source 17. This source supplies a current equal to $I_1+I_2$ which respectively flow in transistors 15 and 16.

Active load 18 is a conventional super diode current mirror which ensures that $I_1=I_2$. As a practical matter a conventional or a Wilson current mirror could be employed in place of load 18.

Load 18 is connected to directly drive the base of transistor 19 which is connected as an emitter follower that includes load resistor 20. Transistor 19 directly drives the base of transistor 21 which is connected as a common-emitter amplifier. Resistor 22 serves as a load for transistor 21. It is to be understood that resistor 22 could be replaced by a current source. The combination of transistors 19 and 21 form a high gain inverting amplifier that has a high input impedance. Therefore, its loading on the input stage is small and the input stage can produce high gain.

This circuit has a significant limitation. When a large signal appears at terminal 12, the collector current and the collector-to-base voltage change of transistor 21 causes the base potential and current to vary. This variation reflects a variation in the input impedance of transistor 19. Thus, the presence of a differential signal at terminals 13 and 14 will result in the diversion of a small but variable portion of $I_2$ into the base of transistor 19. This in turn modulates $I_1$ by the action of load 18. The result is reduced amplifier gain and the accuracy of the current mirror load is impaired.

DESCRIPTION OF THE INVENTION

FIG. 2 is a schematic diagram of the circuit of the invention. Where the parts function in the same way as those of FIG. 1, the same numerals are used. Transistors 15 and 16 are operated differentially via tail current souce 17 and their bases are connected respectively to input terminals 14 and 13. The super diode current mirror load has its emitter follower transistor collector returned to terminal 12 and a second current mirror forces the emitter follower current to track the current in a high gain amplifier transistor. The circuit operates in the following manner.

Transistors 24 and 25 are connected to conduct $I_1$ and $I_2$ respectively. They are matched to conduct equally. Transistor 26 is coupled to transistor 24 so as to force transistor 24 to operate as a diode. The collector of transistor 24 is coupled via transistor 26, operating as an emitter follower, back to the base. The collector of transistor 26 is coupled to output terminal 12, which is the output of buffer 27.

$I_3$ flowing in transistor 21 is selected so that the transistor operates at very high gain. Both transistors 21 and 26 will be subjected to the same current and the same voltage swings. Therefore, if transistors 21 and 26 are matched, there will be no signal induced variation in $I_2$ as was the case in the circuit of FIG. 1.

To ensure equal conduction in transistors 21 and 26, the second current mirror which consists of transistors 28 and 29 is present. Transistor 28 is diode connected and coupled to conduct the current flowing in transistor 21. This current is mirrored in transistor 29 which passes the current flowing in transistor 26. If transistors 28 and 29 are matched, the currents flowing in transistors 26 and 21 will be equal.

This circuit configuration forces $I_1$ to equal $I_2$ and $I_3$ to equal $I_4$. The loading on transistor 16, due to the action of transistor 21 is balanced by the loading of transistor 26 on transistor 15. The overall result is a substantial increase in voltage gain and current mirror load accuracy.

In the schematic diagram of FIG. 3 the invention is shown in relation to a complete op amp. The input stage is as described in FIG. 2. However, the load for transistor 21 is shown as a current source 31. The current thus sourced will flow in transistors 21 and 28 and also in the combination of resistor 34 and diode connected transistors 33 and 32. Theses diodes are poled for forward conduction and develop a voltage drop that will bias output transistors 35 and 36. Resistor 34 will develop a voltage drop that will subtract from the sum of the $V_{BE}$s of transistors 32 and 33. Since transistor 35 and 36 are the op amp output transistors they are made substantially larger in area than the other transistors. Without resistor 34 the current flowing in transistors 35 and 36 would be relatively large. Accordingly, the value of resistor 34 is selected to reduce the quiescent current of transistors 35 and 36 to an acceptable value.

Resistors 37-39 are relatively low value elements that couple the emitters of transistors 35 and 36 together and to output terminal 12. They act to isolate the output transistors from any load element connected to terminal 12.

Diodes 40 and 41 are present to limit conduction in transistors 35 and 36. These diodes will normally be nonconductive because the emitters of transistors 32 and 33 will track the voltage at terminal 12. The output stage constitutes a unity voltage gain buffer that has a large current gain. When a load (not shown) is connected to terminal 12 that would tend to pull it heavily, either high or low diodes 40 and 41 come into play. If terminal 12 is pulled up by the load to more than one $V_{BE}$ above the quiescent reference, diode 41 will conduct and pull the bases of transistors 35 and 36 up so as to prevent an excessive difference. Conversely, if terminal 12 is pulled down by more than one $V_{BE}$ below the quiescent reference, diode 40 will conduct and pull the bases of transistors 35 and 36 down to prevent an excessive difference.

While not an absolute requirement, it is preferred that the transistors used in FIGS. 2 and 3 be made by the process disclosed in the copending patent application Ser. No. 853,530, filed Apr. 18, 1986. This application, by J. Barry Small and Matthew S. Buynoski, is titled A HIGH VOLTAGE COMPLEMENTARY NPN/PNP PROCESS and is assigned to the assignee of the present invention. This invention teaches the fabrication of high performance PNP transistors along with the conventional NPN transistors in a monolithic, junction-isolated, silicon IC. The teaching in this application is incorporated herein by reference.

To summarize, the differential input stage has high voltage gain because the load transistors 25 and 24 present a very high output impedance. Transistor 21 also provides a large voltage gain as outlined above. In combination only two high gain stages provide enough voltage gain for the op amp. The output stage provides the necessary current gain to drive a low impedance load (not shown) connected to output terminal 12.

The circuit of the invention has been described and its use in an op amp set forth. When a person skilled in the art reads the foregoing description, alternatives and equivalents, within the spirit and intent of the invention, will be apparent. For example, the various transistors could be complemented and the power supply polarity reversed. Accordingly, it is intended that the scope of the invention be limited only by the following claims.

We claim:

1. An operational amplifier having a pair of differential signal input terminals, a single-ended output terminal and a high-gain characteristic, said amplifier being connectable to positive and negative supply rails and comprising:

a pair of input transistors having their emitter electrodes coupled through a constant current element to one of said supply rails and having their collectors returned to the other supply rail by way of a first current mirror load;

means for coupling the bases of said pair of input transistors to said signal input terminals;

said first current mirror comprising first and second transistors having their emitters coupled to said other supply rail, their collectors coupled to the collectors of said pair of input transistors and their bases coupled together;

a third transistor having its emitter coupled to said bases of said first and second transistors, its base coupled to said collector of said first transistor and a collector;

a voltage amplifier transistor having a base coupled to said collector of said second transistor, a collector coupled to said amplifier single-ended output terminal and a load element, and an emitter coupled to said other supply rail; and a second current mirror having an input element coupled between said emitter of said voltage amplifier transistor and said other supply rail and an output element coupled to said bases of said first and second transistors.

2. The amplifier of claim 1 wherein said collector of said third transistor is coupled to said single-ended output terminal.

3. The amplifier of of claim 1 wherein said input transistors are complementary to the other transistors in said stage.

4. The amplifier of claim 1 wherein said pair of input transistors are matched together, said first transistor is matched to said second transistor, said third transistor is matched to said voltage amplifier transistor, and the transistors in said second current mirror are matched together.

5. The amplifier of claim 1 wherein said collector of said voltage amplifier transistor is coupled by way of a buffer to said single-ended output terminal.

6. The amplifier of claim 5 wherein said buffer has substantially unity voltage gain and comprises said amplifier output stage.

* * * * *